US010965295B1

(12) United States Patent
Hussien et al.

(10) Patent No.: US 10,965,295 B1
(45) Date of Patent: Mar. 30, 2021

(54) INTEGER BOUNDARY SPUR MITIGATION FOR FRACTIONAL PLL FREQUENCY SYNTHESIZERS

(71) Applicant: GOODIX TECHNOLOGY INC., San Diego, CA (US)

(72) Inventors: Faisal Hussien, San Diego, CA (US); Ahmed Emira, San Diego, CA (US); Esmail Babakrpur Nalousi, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/868,547

(22) Filed: May 7, 2020

(51) Int. Cl.
| H03L 7/07 | (2006.01) |
| H04L 7/033 | (2006.01) |
| H03L 7/197 | (2006.01) |
| H04B 1/04 | (2006.01) |
| H04B 1/16 | (2006.01) |

(52) U.S. Cl.
CPC ............. *H03L 7/1974* (2013.01); *H03L 7/07* (2013.01); *H04B 1/04* (2013.01); *H04B 1/16* (2013.01); *H04L 7/0331* (2013.01)

(58) Field of Classification Search
CPC .......... H03L 7/1974; H03L 7/07; H04B 1/04; H04B 1/16; H04L 7/0331
See application file for complete search history.

(56) References Cited

U.S. PATENT DOCUMENTS

| 5,889,436 A * | 3/1999 | Yeung .................... H03L 7/081 331/14 |
| 6,411,143 B1 * | 6/2002 | Fernandez-Texon ........................ H03L 7/095 327/156 |
| 6,970,030 B1 * | 11/2005 | Huang .................... G06F 7/68 327/156 |
| 8,880,005 B2 * | 11/2014 | Maerzinger ............. H04L 7/033 455/76 |
| 9,531,390 B1 * | 12/2016 | Choi ..................... H03L 7/1976 |
| 2014/0062605 A1 * | 3/2014 | Stengel .................... H03L 7/23 331/34 |

* cited by examiner

*Primary Examiner* — Dinh T Le
(74) *Attorney, Agent, or Firm* — Kilpatrick Townsend & Stockton LLP

(57) ABSTRACT

A clock generation circuit is disclosed. The clock generation circuit includes a first PLL circuit configured to generate a first output clock based on a first input clock, where the first PLL circuit includes a first feedback divider circuit. The clock generation circuit also includes a second PLL circuit configured to generate a second output clock based on a second input clock, where the second PLL circuit includes a second feedback divider circuit. The first input clock is generated based on the second output clock.

20 Claims, 3 Drawing Sheets

| | $f_{xo}$ (mHz) | $f_{out}$ (mHz) | A | N.F | F |
|---|---|---|---|---|---|
| 411 | 32 | 3200.32 | 1 | 100.01 | .01 |
| 421 | 32 | 3200.32 | 1 1/3 | 133.3467 | .3467 |
| 431 | 32 | 2400.24 | 1 1/3 | 100.01 | .01 |
| 441 | 32 | 2400.24 | 1.5 | 112.51125 | .51125 |

US 10,965,295 B1

INTEGER BOUNDARY SPUR MITIGATION FOR FRACTIONAL PLL FREQUENCY SYNTHESIZERS

FIELD OF THE INVENTION

The present application generally pertains to PLL (phase locked loop) circuits, and more particularly to transceiver circuits which have multiple PLL circuits.

BACKGROUND OF THE INVENTION

Phase locked loop (PLL) circuits generate an output clock having a frequency based on an input clock having a frequency typically generated based on a crystal oscillator. The frequency of the output clock may be a multiple of the frequency of the input clock. For some applications, the multiplication factor may be of the form N.F, where N is an integer portion of the multiplication factor, and F is a fraction portion of the multiplication factor. PLL circuits which generate output clocks having an output frequency N.F times the frequency of the input clock, and which require minimal die area to implement are needed in the art.

BRIEF SUMMARY OF THE INVENTION

One inventive aspect is a clock generation circuit. The clock generation circuit includes a first PLL circuit configured to generate a first output clock based on a first input clock, where the first PLL circuit includes a first feedback divider circuit. The clock generation circuit also includes a second PLL circuit configured to generate a second output clock based on a second input clock, where the second PLL circuit includes a second feedback divider circuit. The first input clock is generated based on the second output clock.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
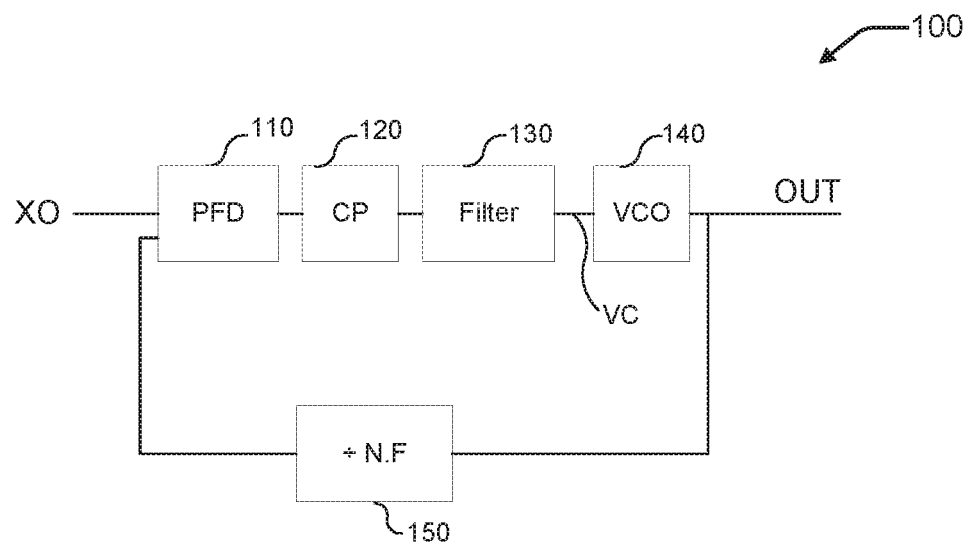
FIG. 1 is a schematic diagram of a phase locked loop (PLL) circuit.

FIG. 1 is a schematic diagram of a phase locked loop (PLL) circuit 100. Phase locked loop circuit 100. Phase locked loop circuit 100 includes phase frequency detector (PFD) 110, charge pump (CP) 120, low-pass filter (LPF) 130, voltage control oscillator (VCO) 140, and divider 150.

Phase locked loop circuit 100 generates an output clock at output node OUT based on an input clock received at input node XO, for example, from a crystal oscillator circuit. The output clock is generated in response to timing differences between clock edges received at input node XO and clock edges received from divider 150.

PFD 110 receives the input clock and the clock generated by divider 150. As understood by those of skill in the art, based on timing differences between the input clock and the clock generated by divider 150, PFD 110 generates pulses which encode the timing differences.

Charge pump 120 receives the pulses and generates an output voltage corresponding with an integration of the pulses.

Low-pass filter 130 receives the output voltage from charge pump 120 and attenuates high-frequency components of the output voltage to generate a voltage at node VC.

Voltage controlled oscillator 140 receives the voltage at node VC and generates the output clock which oscillates at a frequency corresponding with the voltage received at node VC.

Divider 150 receives the output clock and generates the clock edges received by phase frequency detector 110 from divider 150. The clock edges generated by divider 150 occur at a frequency corresponding with the frequency of output signal received from voltage controlled oscillator 140 divided by a particular multiplication factor N.F.

In some embodiments, the multiplication factor is of the form N.F, where N is an integer portion of the multiplication factor, and F is a fraction portion of the multiplication factor.

According to principles well understood in the art, phase locked loop circuit 100 forms a feedback loop which causes the frequency of the clock edges generated by divider 150 to be substantially identical to the frequency of clock edges received from the crystal oscillator. In addition, the feedback loop causes the phase of the clock edges generated by divider 150 to differ from the phase of clock edges received from crystal oscillator by an amount which causes phase frequency detector 110, charge pump, 120, and low-pass filter 130 to collectively generate a voltage at node VC which causes voltage control oscillator 140 to generate the output clock at output node OUT having a frequency, which, when divided by divider 150, is substantially identical to the frequency of the clock edges received by phase frequency detector 110 from the crystal oscillator.

Accordingly, the frequency of the output clock is substantially identical to N.F times the frequency of the input clock.

For example, if the input clock is 32 MHz, and the multiplication factor of divider 150 is equal to 100.01, the frequency of the output clock is substantially identical to 3200.32 MHz.

Figure 2:
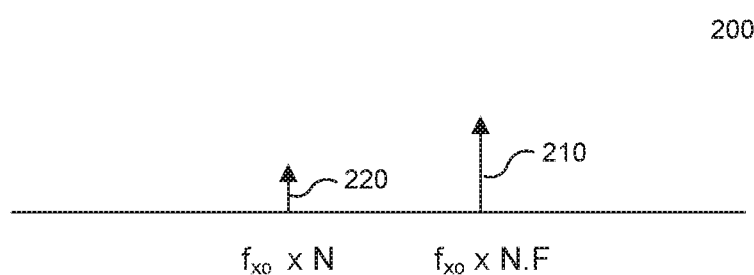
FIG. 2 is a spectral graph illustrating spectral power of the output clock.

FIG. 2 is a spectral graph 200 illustrating spectral power of the output clock. As shown, the largest component of the spectral power 210 is located at the frequency N.F times the frequency of the input clock (fxo). In addition however, because of characteristics of the operation of PLL circuit 100 understood in the art, an additional, undesired, spectral component 220 is located at a frequency N times fxo. The power of the spectral component N×fxo relative to the power of the spectral component N.F×fxo increases as F approaches zero or one.

Accordingly, the power of the spectral component N×fxo relative to the power of the spectral component N.F×fxo is minimum at F=0.5. In some embodiments, the spectral component N×fxo may be zero when F=0.5. Additionally, when F=0, there is no undesired spectral component caused by a non-integer multiplication factor.

Figures 3, 4:
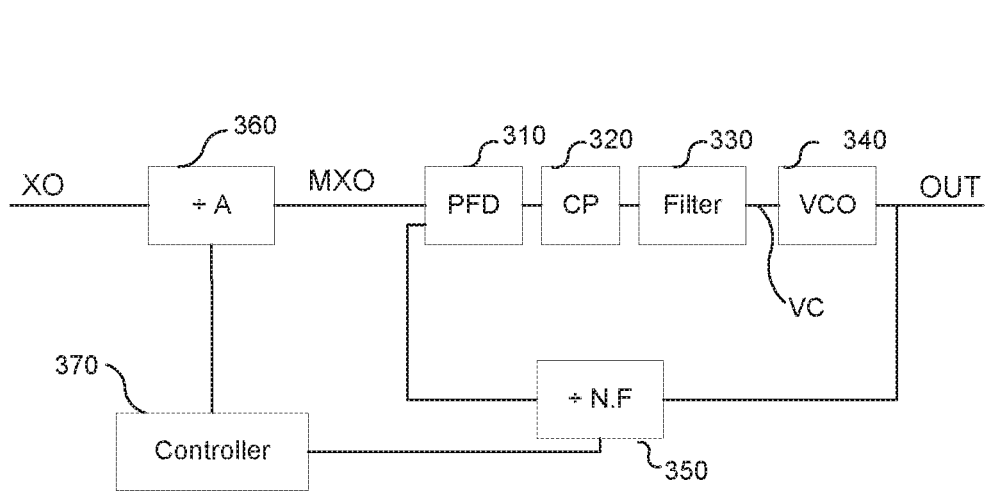
FIG. 3 is a schematic diagram of a phase locked loop (PLL) circuit.
FIG. 4 illustrates a table showing various division factors A and multiplication factors N.F for certain input and output clock frequency combinations.

FIG. 3 is a schematic diagram of a phase locked loop (PLL) circuit 300. Phase locked loop circuit 300. Phase locked loop circuit 300 includes phase frequency detector (PFD) 310, charge pump (CP) 320, low-pass filter (LPF) 330, voltage control oscillator (VCO) 340, feedback divider 350, and input divider 360.

Phase locked loop circuit generates an output clock at output node OUT based on an input clock received at input node XO, for example, from a crystal oscillator circuit. The output clock is generated in response to timing differences between clock edges received at input node XO (which are forwarded to node MXO by input divider 360) and clock edges received from feedback divider 350.

PFD 310 receives a divided input clock at MXO and the clock generated by divider 350. As understood by those of skill in the art, based on timing differences between the divided input clock and the clock generated by divider 350, PFD 310 generates pulses which encode the timing differences.

Charge pump 320 receives the pulses and generates an output voltage corresponding with an integration of the pulses.

Low-pass filter 330 receives the output voltage from charge pump 320 and attenuates high-frequency components of the output voltage to generate a voltage at node VC.

Voltage controlled oscillator 340 receives the voltage at node VC and generates the output clock which oscillates at a frequency corresponding with the voltage received at node VC.

Feedback divider 350 receives the output clock and generates the clock edges received by phase frequency detector 310 from feedback divider 350. The clock edges generated by feedback divider 350 occur at a frequency corresponding with the frequency of output signal received from voltage controlled oscillator 340 divided by a multiplication factor N.F. In some embodiments, feedback divider 350 is programmable, such that the multiplication factor N.F can be changed by controller 370.

Input divider 360 receives the input clock at input node XO and generates a clock at node MXO received by phase frequency detector 310. The clock generated by input divider 360 has a frequency corresponding with the frequency of the input clock at input node XO divided by division factor A. In some embodiments, input divider 360 is programmable, such that the division factor A can be changed by controller 370.

Accordingly, the frequency of the output clock at output node OUT is equal to the frequency of the input clock at input node XO divided by A×N.F, where each of A and N.F are programmable.

The programmability of division factor A and multiplication factor N.F allow for controller 370 to select division factor A and multiplication factor N.F so that F is equal to zero, 0.5, or close to 0.5. Consequently, the power of the spectral component N×fxo relative to the power of the spectral component N.F×fxo may be influenced or controlled so as to be reduced, minimized, or eliminated.

FIG. 4 illustrates a table 400 showing various division factors A and multiplication factors N.F for certain input and output clock frequency combinations.

As shown in row 411, for an input clock frequency of 32 MHz, and a desired 3200.32 MHz output clock frequency, A may be programmed to be equal to 1, and N.F may be programmed to be equal to 100.01. Accordingly, F equals 0.01. However, as discussed above, F being near zero causes a problematic N×fxo spectral component.

The problematic N×fxo spectral component may be reduced or substantially eliminated by changing the multiplication factor N.F, such that F is equal to 0, 0.5, or is near 0.5.

As shown in row 421, for the input clock frequency of 32 MHz and the desired 3200.32 MHz output clock frequency, A may be programmed to be equal to 1⅓, and N.F may be programmed to be equal to 133.3467, such that F is equal to 0.35.

As shown in row 431, for an input clock frequency of 32 MHz, and a desired 2400.24 MHz output clock frequency, A may be programmed to be equal to 1⅓, and N.F may be programmed to be equal to 100.01. Accordingly, F equals 0.01. However, as discussed above, F being near zero causes a problematic N×fxo spectral component.

To reduce or substantially eliminate the problematic spectral component, A and N.F may be reprogrammed. As shown in row 441, for the input clock frequency of 32 MHz and the desired 2400.24 MHz output clock frequency, A may be programmed to be equal to 1.5, and N.F may be programmed to be equal to 112.51125, such that F is equal to 0.51125.

Adequately precise division or multiplication factors may be achieved, using circuit techniques known by those of skill in the art. For example, pulse-swallow and Sigma-Delta techniques are used in some embodiments.

Figure 5:
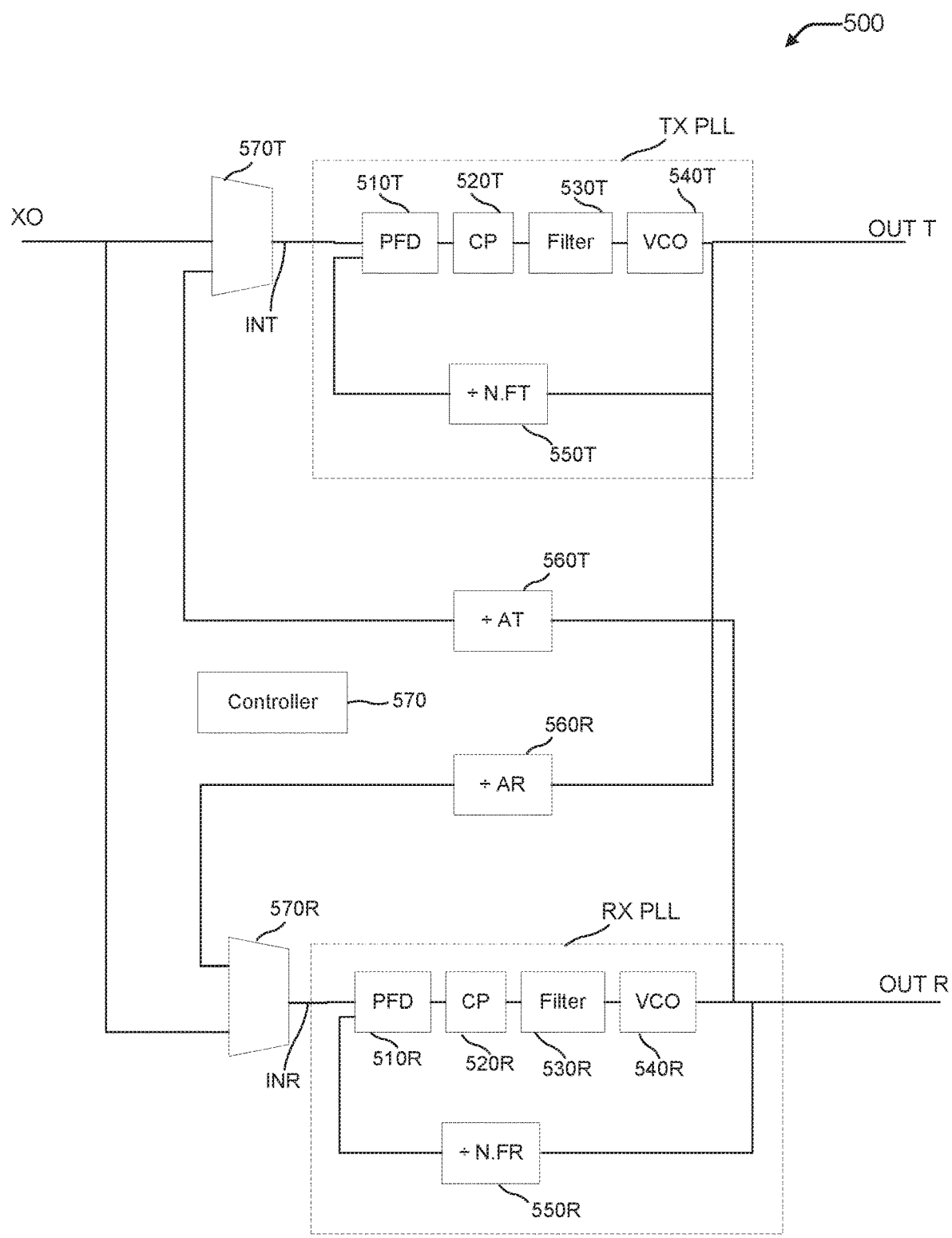
FIG. 5 is a schematic diagram of a phase locked loop circuit including a pair of phase locked loop circuits.

FIG. 5 is a schematic diagram of a phase locked loop circuit 500 including a pair of phase locked loop circuits. The pair of PLL circuits may coexist, for example, as part of a transceiver circuit having a transmit PLL and a receive PLL. Phase locked loop circuit 500 includes a first PLL circuit TXPLL, a second PLL circuit RXPLL, a first multiplexer 570T, a second multiplexer 570R, a first fixed divider 560T, and a second fixed divider 560R.

First PLL circuit TXPLL includes phase frequency detector (PFD) 510T, charge pump (CP) 520T, low-pass filter (LPF) 530T, voltage control oscillator (VCO) 540T, feedback divider 550, and first fixed divider 560T.

Phase frequency detector (PFD) 510T, charge pump (CP) 520T, low-pass filter (LPF) 530T, voltage control oscillator (VCO) 540T, feedback divider 550T, and first fixed divider 560T of first PLL circuit TXPLL cooperatively function to generate an output clock at output node OUTT based on a selected input clock at node INT according to principles discussed herein with reference to the corresponding components of PLL circuits 100 and 300, and according to principles understood by those of skill in the art.

Second PLL circuit RXPLL includes phase frequency detector (PFD) 510R, charge pump (CP) 520R, low-pass filter (LPF) 530R, voltage control oscillator (VCO) 540R, feedback divider 550, and second fixed divider 560R.

Phase frequency detector (PFD) 510R, charge pump (CP) 520R, low-pass filter (LPF) 530R, voltage control oscillator (VCO) 540R, feedback divider 550R, and second fixed divider 560R of second PLL circuit RXPLL cooperatively function to generate an output clock at output node OUTR based on a selected input clock at node INR according to principles discussed herein with reference to the corresponding components of PLL circuits 100 and 300, and according to principles understood by those of skill in the art.

First multiplexer 570T is configured to receive an input clock at input node XO, and a PLL clock from first fixed divider 560T. The received PLL clock has a frequency equal to the frequency of the clock signal generated by second PLL circuit RXPLL divided by the division factor AT of first fixed divider 560T. Based on a control signal from controller 570, first multiplexer 570T provides either the input clock from input node XO or the PLL clock from first fixed divider 560T to node INT.

Second multiplexer 570R is configured to receive an input clock at input node XO, and a PLL clock from second fixed divider 560R. The received PLL clock has a frequency equal to the frequency of the clock signal generated by First PLL circuit TXPLL divided by the division factor AR of second fixed divider 560R. Based on a control signal from controller 570, second multiplexer 570R provides either the input clock from input node XO or the PLL clock from second fixed divider 560R to node INR.

Accordingly, when operating in a first mode, phase locked loop circuit 500 receives an input clock at input node XO and uses first PLL circuit TXPLL to generate an output clock at output node OUTT based on a first PLL clock generated with second PLL circuit RXPLL. Likewise, when operating in a second mode, phase locked loop circuit 500 receives the input clock at input node XO and uses second PLL circuit RXPLL to generate an output clock at output node OUTR based on a second PLL clock generated with first PLL circuit TXPLL.

In the first operating mode, controller 570 provides a control signal to multiplexer 570R which causes multiplexer 570R to provide the input clock from input node XO to node INR. In addition, in the first operating mode, controller 570 provides control signal to multiplexer 570T which causes multiplexer 570T to provide the PLL clock from first fixed divider 560T to node INT.

Therefore, during the first operating mode, second PLL circuit RXPLL receives the input clock and generates a clock signal at output node OUTR. First fixed divider 560T receives the clock signal at output node OUTR and generates a PLL clock, which is provided to first multiplexer 570T. In accordance with the control signal received by multiplexer 570T, multiplexer 570T provides the PLL clock from first fixed divider 560T to node INT. First PLL circuit TXPLL receives the PLL clock and generates an output clock signal at output node OUTT.

Accordingly, in the first operating mode, the frequency of the output clock generated at output node OUTT has a frequency (foutt) equal to the frequency of the input clock at input node XO (fxo) times a second multiplication factor of second feedback divider 550R (N.FR) divided by a first division factor of first fixed divider 560T (AT) times a first multiplication factor of first feedback divider 550T (N.FT).

Therefore, in the first operating mode, foutt=fxo× N.FR÷AT×N.FT.

In the second operating mode, controller 570 provides a control signal to multiplexer 570T which causes multiplexer 570T to provide the input clock from input node XO to node INT. In addition, in the second operating mode, controller 570 provides control signal to multiplexer 570R which causes multiplexer 570R to provide the PLL clock from second fixed divider 560R to node INR.

Therefore, during the second operating mode, first PLL circuit TXPLL receives the input clock and generates a clock signal at output node OUTT. Second fixed divider 560R receives the clock signal at output node OUTT and generates a PLL clock, which is provided to second multiplexer 570R. In accordance with the control signal received by multiplexer 570R, multiplexer 570R provides the PLL clock from second fixed divider 560R to node INR. Second PLL circuit RXPLL receives the PLL clock and generates an output clock signal at output node OUTR.

Accordingly, in the second operating mode, the frequency of the output clock generated at output node OUTR has a frequency (foutr) equal to the frequency of the input clock at input node XO (fxo) times a first multiplication factor of first feedback divider 550T (N.FT) divided by a second division factor of second divider 560R (AR) times a second multiplication factor of second feedback divider 550R (N.FR).

Therefore, in the second operating mode, foutr=fxo× N.FT÷AR×N.FR.

First feedback divider 550T and second feedback divider 550R are each programmable. So the fraction portions FT and FR of the multiplication factors N.FT and N.FR can be modified so that at least the fraction portion of the feedback divider of the PLL generating the output clock can be made equal to zero or 0.5, or near 0.5. In some embodiments, fraction portions FT and FR of the multiplication factors N.FT and N.FR can be modified so that both fraction portions FT and FR can be made equal to zero or 0.5, or near 0.5.

First and second fixed dividers 560T and 560R are not programmable. Because first and second fixed dividers 560T and 560R are not programmable, they are smaller and require less area to implement than dividers used in conventional PLL circuits. Accordingly, a non-limiting example of a technical problem solved by the invention is that the desired functionality is achieved using less area. Among other known benefits, using less area is generally less costly, improves manufacturing yields, and reduces power consumption.

For example, in the first operating mode, where foutt=fxo×N.FR÷AT×N.FT, and where FT is advantageously equal to zero or 0.5, or near 0.5, the controller can program the second feedback divider 550R to have a second multiplication factor N.FR equal to 49.7992, and the first feedback divider 550T to have a first multiplication factor N.FT equal to 100.411181, where the division factor AT of the first fixed divider 560T is equal to 50. With such programming, foutt=32 MHz×49.7992×50× 100.411181=3200.32 MHz.

In some embodiments, first fixed divider 560T and second fixed divider 560R are not used. Instead, first fixed divider 560T and second fixed divider 560R are replaced with a multiplexer circuit similar to first and second multiplexer circuits 570T and 570R, and a single fixed divider. In such embodiments, the multiplexer circuit receives, as inputs, the output clocks at output nodes OUTT and OUTR, and the output of the multiplexer circuit is connected to an input of the single fixed divider. In addition, instead of the separate outputs of the first and second fixed dividers 560T and 560R being respectively connected to the PLL clock inputs of the first and second multiplexer circuits 570T and 570R, the output of the single fixed divider is connected to the PLL clock inputs of both of the first and second multiplexer circuits 570T and 570R.

In some embodiments, first fixed divider 560T and second fixed divider 560R are not used. Instead, the PLL clock input of first multiplexer 570T receives an undivided version of the output clock at output node OUTR, and the PLL clock input of second multiplexer 570R receives an undivided version of the output clock at output node OUTT. In such embodiments, in the first operating mode, foutt=fxo×N.FR× N.FT, and FT is advantageously equal to zero or 0.5, or near 0.5. In such embodiments, in the second operating mode, foutr=fxo×N.FT×N.FR, and FR is advantageously equal to zero or 0.5, or near 0.5.

A fractional portion of a multiplication factor (F, FT, FR) being near 0.5 may be understood as the fractional portion of the multiplication factor being closer to 0.5 than a predetermined threshold. The predetermined threshold may, for example, be equal to 0.05, 0.1, 0.15, 0.2, 0.25, 0.3, 0.35, 0.4, 0.45, or any other number less than 0.5.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A clock generation circuit, comprising:
   a first PLL circuit configured to selectively generate a first output clock based on a first input clock and to selectively generate the first output clock based on a reference clock, wherein the first PLL circuit comprises a first feedback divider circuit; and
   a second PLL circuit configured to selectively generate a second output clock based on a second input clock and to selectively generate the second output clock based on the reference clock, wherein the second PLL circuit comprises a second feedback divider circuit,
   wherein the first input clock is generated based on the second output clock.

2. The clock generation circuit of claim 1, wherein the first input clock is generated by another divider circuit, and wherein a frequency of the first input clock is equal to a frequency of the second input clock divided by a division factor.

3. The clock generation circuit of claim 1, wherein the first feedback divider circuit causes a frequency of the first output clock to be equal to a first multiplication factor times a frequency of the first input clock.

4. The clock generation circuit of claim 3, wherein the first feedback divider is programmable such that the first multiplication factor is programmable.

5. The clock generation circuit of claim 3, wherein the first multiplication factor is equal to N.F, where N is an integer and represents a whole number portion of the first multiplication factor, and wherein F is a number and represents a fraction portion of the first multiplication factor.

6. The clock generation circuit of claim 5, wherein the first multiplication factor is programmed so that F is less than a predetermined threshold.

7. The clock generation circuit of claim 1, wherein the second feedback divider circuit causes a frequency of the second output clock to be equal to a second multiplication factor times a frequency of the first input clock.

8. The clock generation circuit of claim 7, wherein the second feedback divider is programmable such that the second multiplication factor is programmable.

9. The clock generation circuit of claim 7, wherein the second multiplication factor is equal to N.F, where N is an integer and represents a whole number portion of the second multiplication factor, and wherein F is a number and represents a fraction portion of the second multiplication factor.

10. The clock generation circuit of claim 9, wherein the second multiplication factor is programmed so that F is less than a predetermined threshold.

11. The clock generation circuit of claim 1, further comprising an input node configured to receive an external clock signal, wherein a frequency of the second input clock is equal to a frequency of the external clock signal.

12. The clock generation circuit of claim 1, wherein the first PLL circuit is part of a communications transmitter circuit.

13. The clock generation circuit of claim 1, wherein the first PLL circuit is part of a communications receiver circuit.

14. The clock generation circuit of claim 1, wherein the first PLL circuit is one of:
   part of a communications receiver circuit, and
   part of a communications transmitter circuit,
   wherein the second PLL circuit is one of:
   part of a communications receiver circuit, and
   part of a communications transmitter circuit.

15. A method of operating a clock generation circuit, the method comprising:
   with a first PLL circuit, selectively generating a first output clock based on a first input clock, wherein the first PLL circuit comprises a first feedback divider circuit;
   with the first PLL circuit, selectively generating the first output clock based on a reference clock;
   with a second PLL circuit gent circuit, generating a second output clock based on a second input clock, wherein the second PLL circuit comprises a second feedback divider circuit;
   with the second PLL circuit, selectively generating the second output clock based on the reference clock; and
   generating the first input clock based on the second output clock.

16. The method of claim 15, wherein the first input clock is generated by another divider circuit, and wherein a frequency of the first input clock is equal to a frequency of the second input clock divided by a division factor.

17. The method of claim 15, further comprising, with the first feedback divider circuit, causing a frequency of the first output clock to be equal to a first multiplication factor times a frequency of the first input clock.

18. The method of claim 15, further comprising, with the second feedback divider circuit, causing a frequency of the second output clock to be equal to a second multiplication factor times a frequency of the first input clock.

19. The method of claim 15, further comprising, at an input node receiving an external clock signal, wherein a frequency of the second input clock is equal to a frequency of the external clock signal.

20. The method of claim 15,
   wherein the first PLL circuit is one of:
      part of a communications receiver circuit, and
      part of a communications transmitter circuit,
   wherein the second PLL circuit is one of:
      part of a communications receiver circuit, and
      part of a communications transmitter circuit.

* * * * *